United States Patent
Toyomura et al.

(10) Patent No.: US 11,195,736 B2
(45) Date of Patent: Dec. 7, 2021

(54) SUBSTRATE PROCESSING APPARATUS, METHOD OF DETACHING SUBSTRATE FROM VACUUM SUCTION TABLE OF SUBSTRATE PROCESSING APPARATUS, AND METHOD OF PLACING SUBSTRATE ONTO VACUUM SUCTION TABLE OF SUBSTRATE PROCESSING APPARATUS

(71) Applicant: EBARA CORPORATION, Tokyo (JP)

(72) Inventors: Naoki Toyomura, Tokyo (JP); Mitsuru Miyazaki, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 70 days.

(21) Appl. No.: 15/372,033

(22) Filed: Dec. 7, 2016

(65) Prior Publication Data

US 2017/0162409 A1 Jun. 8, 2017

(30) Foreign Application Priority Data

Dec. 7, 2015 (JP) .............................. JP2015-238395

(51) Int. Cl.
  *H01L 21/683* (2006.01)
  *H01L 21/687* (2006.01)
  *H01L 21/67* (2006.01)

(52) U.S. Cl.
  CPC .. *H01L 21/67219* (2013.01); *H01L 21/67196* (2013.01); *H01L 21/6838* (2013.01); *H01L 21/68742* (2013.01)

(58) Field of Classification Search
  CPC ......... H01L 21/67219; H01L 21/67196; H01L 21/6838; H01L 21/68742; H01L 21/6875;
(Continued)

(56) References Cited

U.S. PATENT DOCUMENTS 5,352,294 A * 10/1994 White ................... C23C 16/042
                                                      118/725
5,860,181 A    1/1999 Maekawa et al.
(Continued)

FOREIGN PATENT DOCUMENTS

JP    H08-071511 A    3/1996
JP    H09-092633 A    4/1997
(Continued)

*Primary Examiner* — Karla A Moore
*Assistant Examiner* — Margaret D Klunk
(74) *Attorney, Agent, or Firm* — BakerHostetler

(57) ABSTRACT

An object of the present invention is to detach a substrate from a table without damaging the substrate by lift pins. One embodiment of the present invention provides a substrate processing apparatus having a vacuum suction table adapted to have a substrate placed thereon, and a plurality of lift pins disposed along the outer periphery of the vacuum suction table. The lift pins each have a distal end portion including a substrate guide surface capable of guiding the outer peripheral end surface of the substrate, and a proximal end portion including a substrate holding surface extending from the substrate guide surface outwardly in a radial direction of the lift pin. The lift pins are stoppable in a lower end position where the substrate guide surface of each of the lift pins is disposed below a suction-holding surface of the vacuum suction table, an upper end position where the substrate holding surface of each of the lift pins is disposed above the suction-holding surface of the vacuum suction table, and an intermediate position between the lower end position and the upper end position. In the intermediate position, the substrate guide surface of each of the lift pins is disposed above the suction-holding surface of the vacuum suction table, and the substrate holding surface of each of the lift pins is disposed below the suction-holding surface of the vacuum suction table.

7 Claims, 9 Drawing Sheets

(58) Field of Classification Search
CPC .. F04B 9/02; F15B 11/12; F15B 11/13; F15B 11/121; F15B 15/1409
See application file for complete search history.

(56) References Cited

U.S. PATENT DOCUMENTS

| | | | |
|---|---|---|---|
| 2007/0090520 A1* | 4/2007 | Choi | H01L 21/67109 257/712 |
| 2008/0085658 A1* | 4/2008 | Katsuoka | B24B 37/04 451/7 |
| 2009/0133722 A1* | 5/2009 | Koh | B08B 1/04 134/63 |
| 2010/0264115 A1* | 10/2010 | Kawamura | C23C 16/4585 216/67 |

FOREIGN PATENT DOCUMENTS

| | | |
|---|---|---|
| JP | H10-102259 A | 4/1998 |
| JP | 2005-129837 A | 5/2005 |
| JP | 2006-024837 A | 1/2006 |

\* cited by examiner

SUBSTRATE PROCESSING APPARATUS, METHOD OF DETACHING SUBSTRATE FROM VACUUM SUCTION TABLE OF SUBSTRATE PROCESSING APPARATUS, AND METHOD OF PLACING SUBSTRATE ONTO VACUUM SUCTION TABLE OF SUBSTRATE PROCESSING APPARATUS

CROSS-REFERENCE TO RELATED APPLICATION

This application claims priority to Japanese Patent Application No. 238395/2015filed on Dec. 7, 2015. The entire disclosure of Japanese Patent Application No. 238395/2015filed on Dec. 7, 2015is incorporated herein by reference in its entirety.

TECHNICAL FIELD

The present invention relates to a substrate processing apparatus for processing substrates such as semiconductor wafers, a method of detaching a substrate from a vacuum suction table of a substrate processing apparatus, and a method of placing a substrate onto a vacuum suction table of a substrate processing apparatus.

BACKGROUND ART

In the manufacture of semiconductor devices, a chemical-mechanical polishing (CMP) system has been known as an apparatus for polishing the surface of a substrate such as a wafer WF. The CMP system has a polishing table, which has a polishing pad attached on the top surface thereof to thereby form a polishing surface. In the CMP system, a surface to be polished of a substrate held by a top ring is pressed against the polishing surface, and the polishing table and the top ring are rotated while a slurry as a polishing liquid is being supplied to the polishing surface. In this way, the polishing surface and the surface to be polished are slidingly moved relative to each other, to thereby polish the surface to be polished.

In the typical CMP system, the polishing table or the polishing pad is larger in size than a substrate to be polished, and the substrate is polished by being held by the top ring with the surface to be polished facing downward. The substrate after being polished is cleaned by bringing a sponge material of polyvinyl alcohol (PVA) or the like into contact with the substrate while rotating the sponge material. Further, the cleaned substrate is dried.

The applicant of the present application has filed patent applications regarding a technique in which a substrate after being polished is subjected to slight additional polishing or cleaned with a finishing unit provided in a CMP system separately from the main polishing unit, the finishing unit being configured such that a contact member smaller in diameter than the substrate is pressed against the polished substrate surface and moved relative to the substrate (Patent Documents 1and 2).

In the finishing unit, in order to allow the contact member to contact the substrate under a high pressure to thereby increase the cleaning effect or the polishing rate, it is necessary to hold the substrate with a table in contact with the whole backside of the substrate.

Specifically, the table has a support surface formed with a plurality of openings communicating with a fluid passage connected to a vacuum source, and the substrate is vacuum-held to the table through these openings. The substrate may be vacuum-held to the table through a backing material made of elastic polyurethane foam, for example. In this case, the backing material is provided with through-holes at respective positions corresponding to the openings in the table.

For placing a substrate onto the table or detaching the substrate from the table, a plurality of extendable/retractable lift pins disposed along the outer periphery of the table may be used. Specifically, the lift pins receive a substrate, which is transferred by a transfer robot, at a position above the support surface of the table, i.e. an upper end position, by supporting the lower surface of the substrate. Thereafter, the lift pins are lowered to a position below the support surface of the table at which the lift pins will not interfere with the rotation of the table during substrate cleaning or polishing process, i.e. a lower end position. During the lowering of the lift pins, the substrate is placed onto the support surface of the table when the lift pins pass the table. After completion of a processing on the table, the lift pins are raised from the lower end position to the upper end position. During the raising of the lift pins, when the lift pins pass the table, the lift pins abut against and support the lower surface of the substrate to lift the substrate. When the lift pins reach the upper end position, the transfer robot lifts up the substrate by scooping up the substrate from below, thereby delivering the substrate from the lift pins to the transfer robot.

CITATION LIST

Patent Documents

[Patent Document 1] Japanese Patent Laid-Open Publication No. Hei 9-92633

[Patent Document 2] Japanese Patent Laid-Open Publication No. Hei 8-71511

SUMMARY OF INVENTION

As has been stated above, when a substrate is transferred between the table and the transfer robot, the lift pins, usually, move continuously (i.e. without stopping) between two positions, i.e. the upper end position and the lower end position, and during the continuous movement of the lift pins, the substrate is placed onto the table or detached therefrom. At this time, particularly when the substrate is to be detached from the table, the substrate cannot easily be separated from the support surface of the table even after the introduction of a vacuum to the support surface has been stopped; therefore, the lift pins may damage the substrate. The reason why the substrate cannot easily be separated from the support surface of the table is due mainly to the effect of water or a backing material (when used) present between the substrate and the support surface.

One embodiment of the present invention can provide a substrate processing apparatus capable of detaching the substrate from the table without damaging the substrate by the lift pins. In addition, one embodiment of the present invention can provide a substrate detaching method capable of detaching the substrate from the table without damaging the substrate by the lift pins.

According to one embodiment of the present invention, there is provided a substrate processing apparatus having a vacuum suction table adapted to have a substrate placed thereon, and a plurality of lift pins disposed along the outer periphery of the vacuum suction table. The plurality of lift pins each have a distal end portion including a substrate guide surface capable of guiding the outer peripheral end surface of the substrate, and a proximal end portion including a substrate holding surface extending from the substrate guide surface outwardly in a radial direction of the lift pin. The plurality of lift pins are stoppable in a lower end position where the substrate guide surface of each of the lift pins is disposed below a suction-holding surface of the vacuum suction table, an upper end position where the substrate holding surface of each of the lift pins is disposed above the suction-holding surface of the vacuum suction table, and an intermediate position between the lower end position and the upper end position. In the intermediate position, the substrate guide surface of each of the lift pins is disposed above the suction-holding surface of the vacuum suction table, and the substrate holding surface of each of the lift pins is disposed below the suction-holding surface of the vacuum suction table. With this arrangement, the lift pins can be held in the intermediate position between the lower end position and the upper end position while the vacuum is being broken between the substrate and the suction-holding surface of the vacuum suction table. In the intermediate position, the outer periphery of the substrate can be surrounded by the substrate guide surfaces of the lift pins. Therefore, it is possible to prevent the detached substrate from sliding sideways relative to the suction-holding surface. Accordingly, the substrate can be detached from the vacuum suction table without being damaged by the lift pins.

According to one embodiment of the present invention, there is provided a method of detaching a substrate from a vacuum suction table of a substrate processing apparatus. The method includes preparing a plurality of lift pins disposed along an outer periphery of the vacuum suction table and each having a distal end portion and a proximal end portion, the distal end portion including a substrate guide surface capable of guiding an outer peripheral end surface of the substrate, the proximal end portion including a substrate holding surface extending from the substrate guide surface outwardly in a radial direction of the lift pin, and stopping the plurality of lift pins in a lower end position where the lift pins do not interfere with the rotation of the vacuum suction table, an upper end position where the lift pins hold the substrate above a suction-holding surface of the vacuum suction table, and an intermediate position between the lower end position and the upper end position. The method includes the steps of: raising the plurality of lift pins from the lower end position to the intermediate position; stopping introduction of a vacuum to the suction-holding surface of the vacuum suction table; supplying a fluid to the suction-holding surface of the vacuum suction table; and raising the plurality of lift pins from the intermediate position to the upper end position when the pressure at the suction-holding surface of the vacuum suction table reaches a pressure not lower than a predetermined pressure. With this arrangement, the lift pins can be held in the intermediate position between the lower end position and the upper end position while the vacuum is being broken between the substrate and the suction-holding surface of the vacuum suction table. Accordingly, it is possible to prevent the detached substrate from sliding sideways relative to the suction-holding surface by surrounding the outer periphery of the substrate by the substrate guide surfaces of the lift pins, for example. Consequently, the substrate can be detached from the vacuum suction table without being damaged by the lift pins.

According to one embodiment of the present invention, there is provided a method of placing a substrate onto a vacuum suction table of a substrate processing apparatus. The method includes preparing a plurality of lift pins disposed along an outer periphery of the vacuum suction table and each having a distal end portion and a proximal end portion, the distal end portion including a substrate guide surface capable of guiding an outer peripheral end surface of the substrate, the proximal end portion including a substrate holding surface extending from the substrate guide surface outwardly in a radial direction of the lift pin, and stopping the plurality of lift pins in a lower end position where the lift pins do not interfere with the rotation of the vacuum suction table, an upper end position where the lift pins hold the substrate above a suction-holding surface of the vacuum suction table, and an intermediate position between the lower end position and the upper end position. The method includes the steps of: lowering the plurality of lift pins from the upper end position to the intermediate position; introducing a vacuum to the suction-holding surface of the vacuum suction table; and lowering the plurality of lift pins from the intermediate position to the lower end position when the pressure at the suction-holding surface of the vacuum suction table reaches a pressure not higher than a predetermined pressure. With this arrangement, the substrate can be suppressed from sliding sideways when a vacuum is introduced to the suction-holding surface of the vacuum suction table, particularly in a case that water or the like exists on the suction-holding surface.

DESCRIPTION OF EMBODIMENTS

An embodiment of a substrate processing apparatus according to the present invention will be explained below with reference to the accompanying drawings. In this embodiment, a buffing apparatus 300A will be described as an example of the substrate processing apparatus. The substrate processing apparatus according to the present invention, however, is not limited to the buffing apparatus but may be any processing apparatus having a vacuum suction table adapted to have a substrate placed thereon and a plurality of lift pins disposed along the outer periphery of the vacuum suction table.

Figure 1:
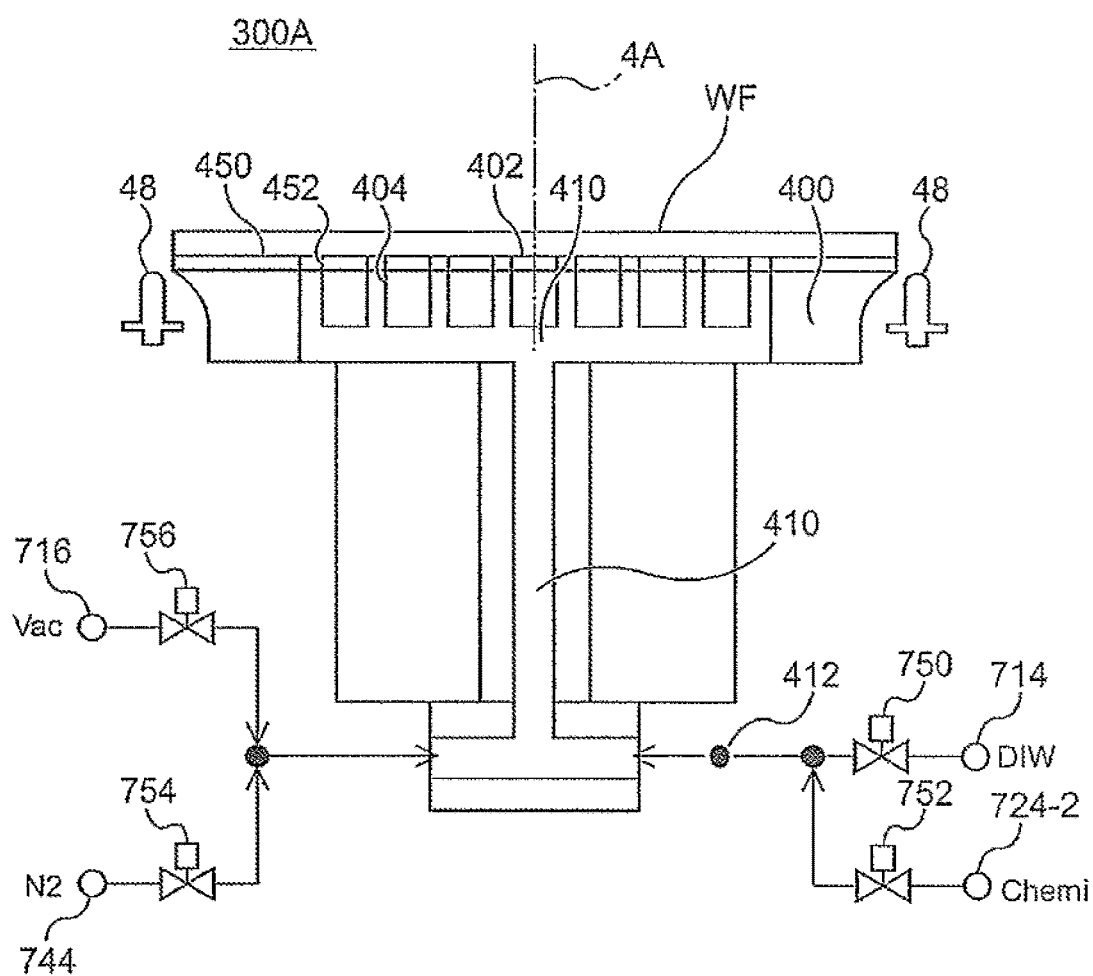
FIG. 1 is a schematic sectional view of an example of a substrate processing apparatus according to one embodiment of the present invention, showing a vacuum suction table having a substrate placed thereon and peripheral parts thereof.

FIG. 1 is a schematic view of the buffing apparatus 300A, showing a buffing table (i.e. a vacuum suction table) 400 having a wafer (i.e. a substrate) WF placed thereon, and peripheral parts thereof. The buffing apparatus 300A shown in FIG. 1 may be constructed as a part of a CMP (Chemical-Mechanical Polishing) system, which polishes substrates such as semiconductor wafers, or as one unit in a CMP system. As an example, the buffing apparatus 300A may be incorporated in a CMP system having a polishing unit, a cleaning unit, and a substrate transfer mechanism, and the buffing apparatus 300A may be used for finish processing performed after main polishing in the CMP system.

The term "buffing" as used in this specification includes at least one of buff polishing and buff cleaning.

Buff polishing is a processing in which a substrate and a buffing pad are moved relative to each other, with the buffing pad in contact with the substrate, and with a slurry being interposed between the substrate and the buffing pad, thereby polishing the processed surface of the substrate. The buff polishing can apply to the substrate a stronger physical acting force than a physical acting force applied to the substrate when the substrate is cleaned by a physical action using a sponge material (e.g. a PVA sponge material) or the like. Therefore, as the buffing pad, it is possible to use a pad formed of a laminate of polyurethane foam and non-woven fabric, for example. Specifically, it is possible to use commercially available IC1000™/SUBA® pads and suede porous polyurethane non-fibrous pads. Specific examples include commercially available POLITEX® pads. The buff polishing is capable of achieving removal of a surface layer damaged (e.g. scratched) or contaminated, or additional removal of a spot left unremoved by main polishing in the main polishing unit, or improvement of morphology, such as the surface roughness of micro regions and the film thickness distribution over the whole substrate after the main polishing.

Buff cleaning is a processing in which a substrate and a buffing pad are moved relative to each other, with the buffing pad in contact with the substrate, and with a cleaning solution (a chemical solution, or a chemical solution and pure water) being interposed between the substrate and the buffing pad, thereby removing a contamination from the substrate surface or modifying the processed surface. The buff cleaning can apply to the substrate a stronger physical acting force than a physical acting force applied to the substrate when the substrate is cleaned by a physical action using a sponge material or the like. Therefore, as the buffing pad, it is possible to use the above-mentioned IC1000™/SUBA® pads and POLITEX® pads. Further, a PVA sponge may also be used as a buffing pad in the buffing apparatus 300A of the present invention.

The buffing table 400 has a support surface (i.e. suction-holding surface) 402 for supporting a wafer WF. The support surface 402 has openings 404 of a vacuum passage 410 usable for sucking the wafer WF. The vacuum passage 410 is connected to a vacuum source 716, so that the wafer WF can be held to the support surface 402 by vacuum suction. The wafer WF may be held to the buffing table 400 through a backing material 450. The backing material 450 may be made of elastic polyurethane foam, for example. Alternatively, the backing material 450 may be silicone rubber. The backing material 450 can be used as a cushioning material between the buffing table 400 and the wafer WF to prevent damage to the wafer WF or to reduce the effect of the surface roughness of the buffing table 400 on the buffing process. The backing material 450 may be attached to the surface of the buffing table 400 with pressure-sensitive adhesive tape. As the backing material 450, a publicly known one may be used which is provided with through-holes 452 at respective positions corresponding to the openings 404 in the buffing table 400.

It should be noted that, when the wafer WF is attached to the buffing table 400 through the backing material 450, the surface of the backing material 450 as attached to the buffing table 400 provides the "support surface" for supporting the wafer WF, and when the wafer WF is held directly to the buffing table 400 with no backing material 450 interposed therebetween, the surface of the buffing table 400 provides the "support surface" for supporting the wafer WF. The term "the support surface" or "the support surface of the buffing table" as used hereinafter shall include both of the above cases.

Further, the buffing table 400 has lift pins 48 as a transfer mechanism associated with the buffing table 400 to receive a wafer WF transferred by a transfer robot (not shown) and to place the wafer WF onto the buffing table 400. There is a plurality of lift pins 48 disposed along the outer periphery of the buffing table 400. The lift pins 48 are extendable and retractable. The lift pins 48 receive the wafer WF by supporting the outer peripheral portion thereof in a state where the lift pins 48 extend, and thereafter, the lift pins 48 retract to place the wafer WF onto the support surface 402 of the buffing table 400. After the completion of buffing, the lift pins 48 extend to lift the wafer WF by supporting the outer peripheral portion thereof, and the transfer robot scoops up the wafer WF from below. In this embodiment, the lift pins 48 when extended and retracted are stepwisely movable between an upper end position, an intermediate position, and a lower end position, which will be explained later.

Further, the buffing table 400 is configured to be rotatable about a rotation axis 4A by a driving mechanism (not shown).

As has been stated above, the buffing table 400 has a vacuum passage 410 through which a vacuum is introduced to hold the wafer WF to the support surface 402 by vacuum suction. The vacuum passage 410 is connectable to a nitrogen source 744 used for detachment of the wafer WF and to a pure water supply source 714 and a chemical solution supply source 724-2, which are optionally usable to clean the support surface 402 of the buffing table 400. Pure water can also be supplied from the pure water supply source 714 when the wafer WF is to be detached from the buffing table 400. A mixture of pure water and nitrogen may be supplied in place of pure water alone. Pipes for supplying a vacuum, pure water, a chemical solution, and nitrogen gas to the vacuum passage 410 of the buffing table 400 are provided with on-off valves 756, 750, 752, and 754, respectively. A vacuum, pure water, a chemical solution, and nitrogen gas can be supplied to the support surface 402 through the vacuum passage 410 of the buffing table 400 at any desired timing by controlling on-off of the on-off valves 756, 750, 752, and 754 using a control device (not shown). A pressure sensor 412 for measuring the pressure in the vacuum passage 410 may be provided in the piping system as shown in FIG. 1.

Figure 2:
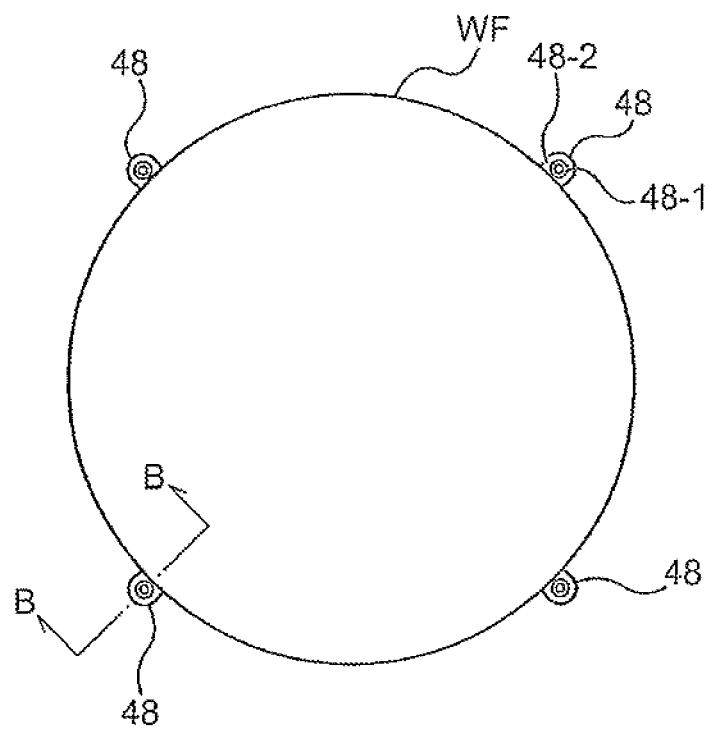
FIG. 2 is a top view showing the way in which lift pins are disposed relative to the substrate.

FIG. 2 is a top view showing the way in which the plurality of lift pins 48, shown in FIG. 1, are disposed relative to the wafer WF. As shown in FIG. 2, in this embodiment, a plurality (four in the illustrated example) of lift pins 48 are disposed along the outer periphery of the wafer WF at equal intervals. The lift pins 48 each have a distal end portion including a substrate guide surface 48-1 capable of guiding the outer peripheral end surface of the wafer WF, and a proximal end portion including a substrate holding surface 48-2 extending from the substrate guide surface 48-1 outwardly in a radial direction of the lift pin 48 so that the substrate holding surface 48-2 is capable of abutting against the lower surface of the wafer WF. The substrate guide surface 48-1 is a substantially circular cylindrical outer peripheral surface including a tapered portion 48-1a (see FIG. 4A and so forth). The lift pins 48 may be made of a carbon fiber reinforced PEEK (polyether ether ketone) resin, for example, so as to prevent electrification of the wafer WF.

Figure 3:
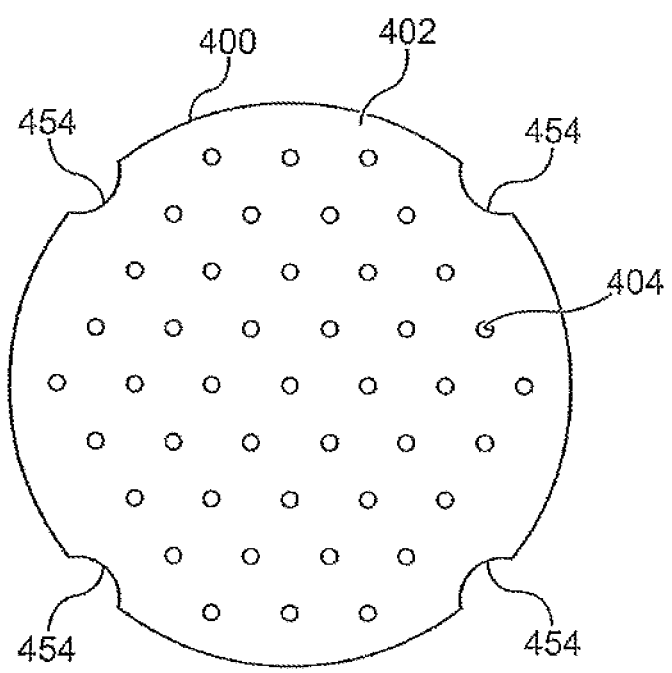
FIG. 3 is an illustration showing a suction-holding surface of the vacuum suction table.

The wafer WF is placed on the support surface 402 of the buffing table 400. FIG. 3 is a drawing showing the support surface 402 of the buffing table 400. As shown in FIG. 3, the support surface 402 is formed with a plurality of openings 404 (through-holes 452 communicating with the openings 404, respectively, when the backing material 450 is used). The plurality of openings 404 are communicated with the vacuum passage 410 shown in FIG. 1, thereby allowing a vacuum to be introduced between the wafer WF and the support surface 402 through the vacuum passage 410 during buffing of the wafer WF.

Further, the outer periphery of the buffing table 400 is formed with a plurality of arcuate cut-out portions 454 at respective positions corresponding to the lift pins 48. When the backing material 450 is used, similar cut-out portions are formed at respective positions of the backing material 450 corresponding to the cut-out portions 454 of the buffing table 400. Each cut-out portion 454 is configured to be capable of receiving at least a part of the substrate holding surface 48-2 of the associated lift pin 48, thereby allowing the lift pin 48 to be raised and lowered relative to the buffing table 400. It should be noted that the configuration of the cut-out portions 454 is not particularly limited, but any desired configuration may be used.

It should be noted that, in this embodiment, the radius of the wafer WF and the radius of the buffing table 400 are set substantially equal to each other. Accordingly, each cut-out portion 454 receives only the substrate holding surface 48-2 of the associated lift pin 48. However, the cut-out portion 454 may receive not only the substrate holding surface 48-2 but also the substrate guide surface 48-1 of the lift pin 48, depending on the radius of the wafer WF and the sizes of the cut-out portion 454 and the lift pin 48.

In this embodiment, the plurality of lift pins 48 are stepwisely movable between a lower end position where each lift pin 48 is disposed entirely outside of the associated cut-out portion 454 of the buffing table 400 so as not to interfere with the rotation of the buffing table 400 during buffing, an upper end position where the plurality of lift pins 48 hold the wafer WF above the support surface 402 of the buffing table 400, and an intermediate position between the lower end position and the upper end position (i.e. stoppable in the lower end position, the upper end position, and the intermediate position).

Figure 4A:
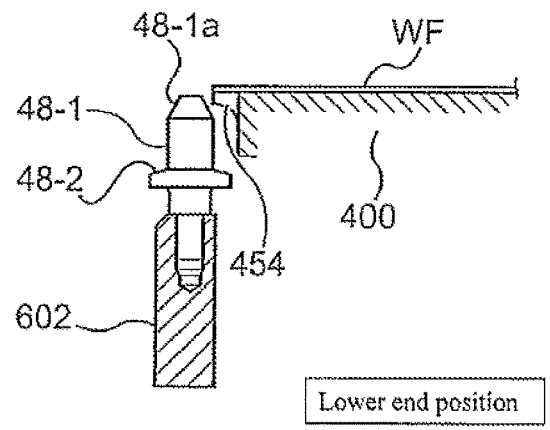
FIG. 4A is a schematic sectional view taken along the line B-B in FIG. 2, showing a lower end position of the lift pins.
Figure 4B:
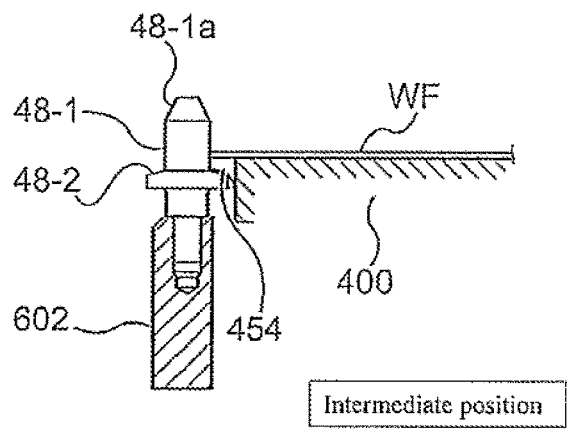
FIG. 4B is a schematic sectional view taken along the line B-B in FIG. 2, showing an intermediate position of the lift pins.
Figure 4C:
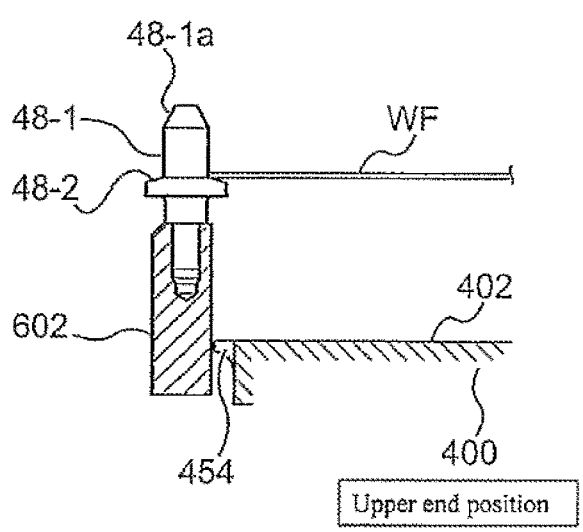
FIG. 4C is a schematic sectional view taken along the line B-B in FIG. 2, showing an upper end position of the lift pins.

FIGS. 4A to 4C are schematic sectional views taken along the line B-B in FIG. 2, showing the lower end position, intermediate position and upper end position, respectively, of the lift pins 48. In the lower end position, shown in FIG. 4A, no part of the lift pin 48 is present in the cut-out portion 454; therefore, the lift pin 48 will not interfere with the rotation of the buffing table 400 during buffing. In the intermediate position, shown in FIG. 4B, the substrate guide surface 48-1 of the lift pin 48 extends to a position above the support surface 402 of the buffing table 400, and the substrate holding surface 48-2 of the lift pin 48 is located in the cut-out portion 454. A distance between the substrate guide surface 48-1 and the rotation axis 4A of the buffing table 400 (see FIG. 1) is set to be equal to or slightly larger than a radius of the wafer WF. If a gap between an outer peripheral end surface of the wafer WF and the substrate guide surface 48-1 is large, eccentric rotation of the wafer WF occurs. Therefore, it is preferred to minimize the gap between the outer peripheral end surface of the wafer WF and the substrate guide surface 48-1. Thus, the outer periphery of the wafer WF placed on the support surface 402 of the buffing table 400 can be surrounded by the substrate guide surfaces 48-1 of the plurality of lift pins 48 (see FIG. 2). In the intermediate position, however, the substrate holding surface 48-2 need not necessarily be located in the cut-out portion 454.

The lift pins 48 are held in the intermediate position, shown in FIG. 4B, during a predetermined time period when the wafer WF is to be detached from the buffing table 400 and when the wafer WF is to be placed onto the buffing table 400. Specifically, when the wafer WF is to be detached from the buffing table 400, the lift pins 48 are held in the intermediate position until the pressure in the vacuum passage 410 (hence, the pressure at the support surface 402) reaches a pressure not lower than a predetermined pressure after the introduction of a vacuum between the wafer WF and the support surface 402 through the vacuum passage 410 shown in FIG. 1 has been stopped. When the wafer WF is to be placed onto the buffing table 400, the lift pins 48 are held in the intermediate position until the pressure in the vacuum passage 410 (hence, the pressure at the support surface 402) reaches a pressure not higher than a predetermined pressure after the introduction of a vacuum to the support surface 402 of the buffing table 400 through the vacuum passage 410 shown in FIG. 1 has been started.

In the upper end position shown in FIG. 4C, the wafer WF is held above the support surface 402 of the buffing table 400 by the lift pins 48 so that the wafer WF can be delivered to a transfer robot (not shown).

Figure 5A:
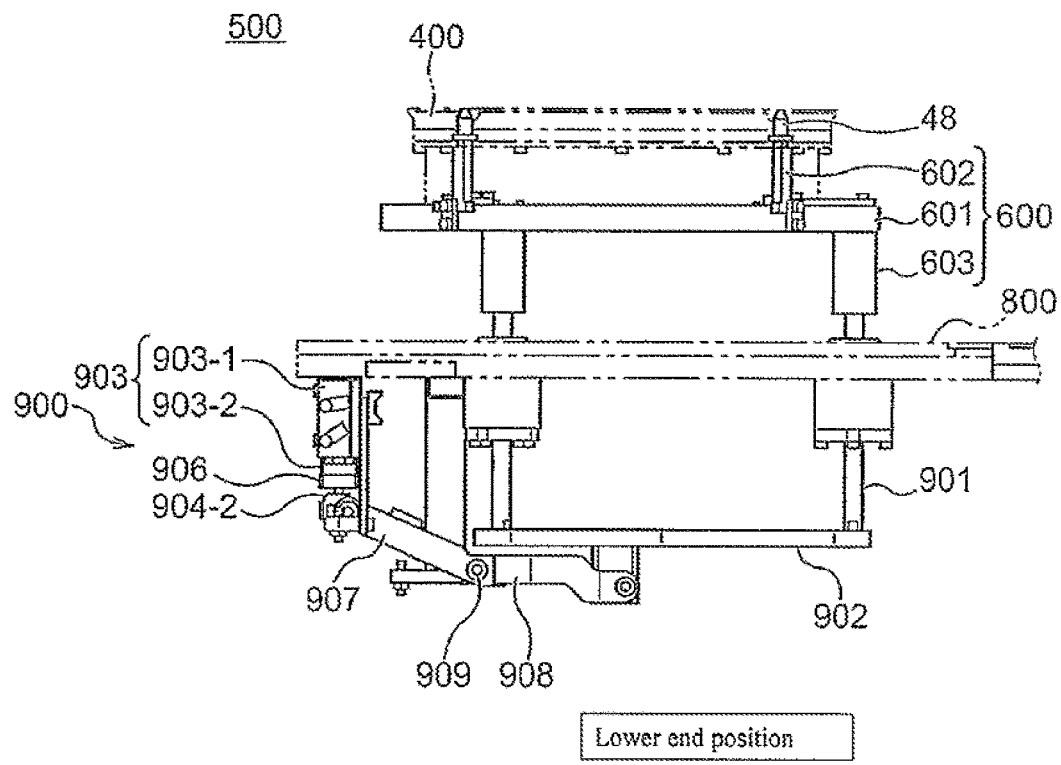
FIG. 5A is a side view showing a lift pin operating device when the lift pins are in the lower end position.
Figure 5B:
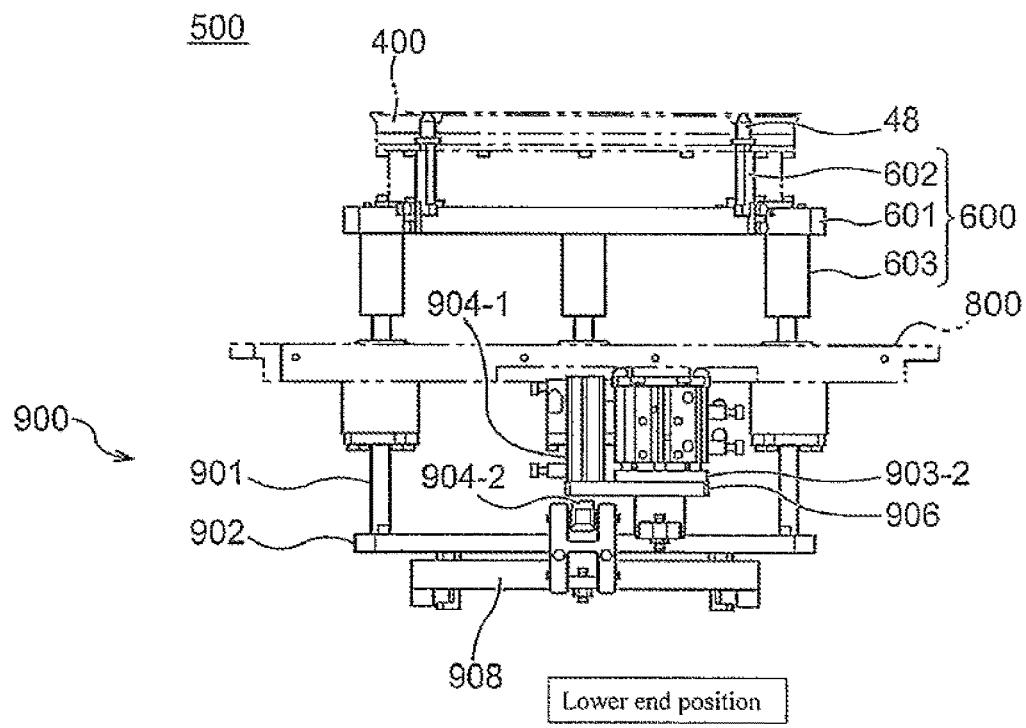
FIG. 5B is a front view showing the lift pin operating device when the lift pins are in the lower end position.
Figure 6A:
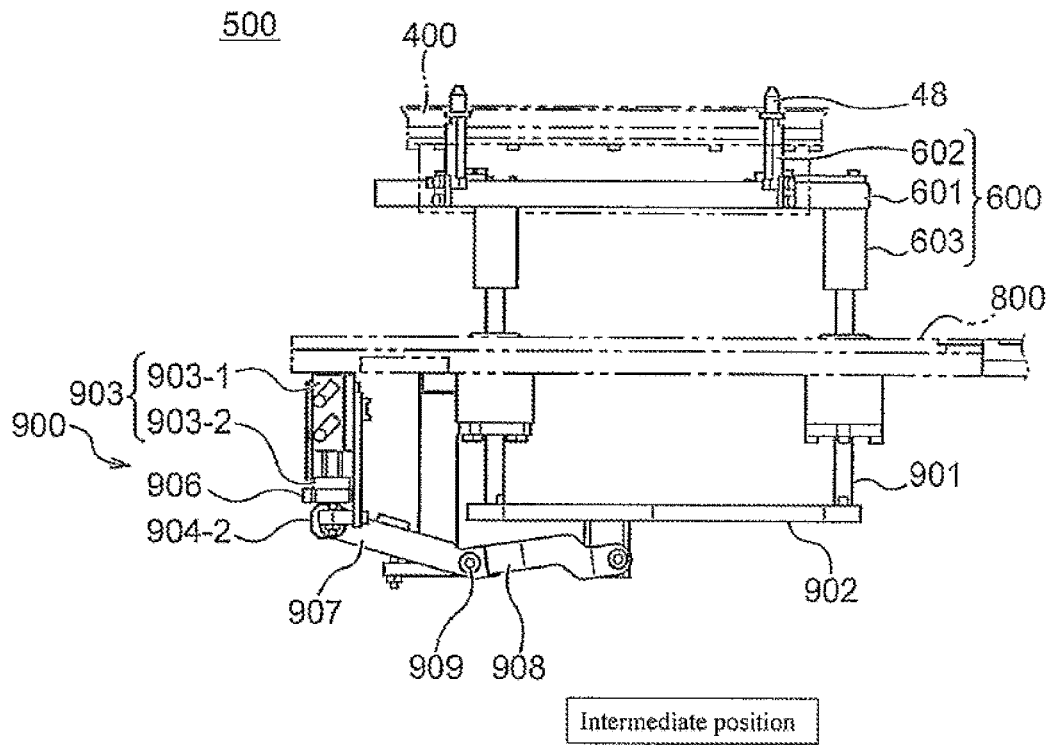
FIG. 6A is a side view showing the lift pin operating device when the lift pins are in the intermediate position.
Figure 6B:
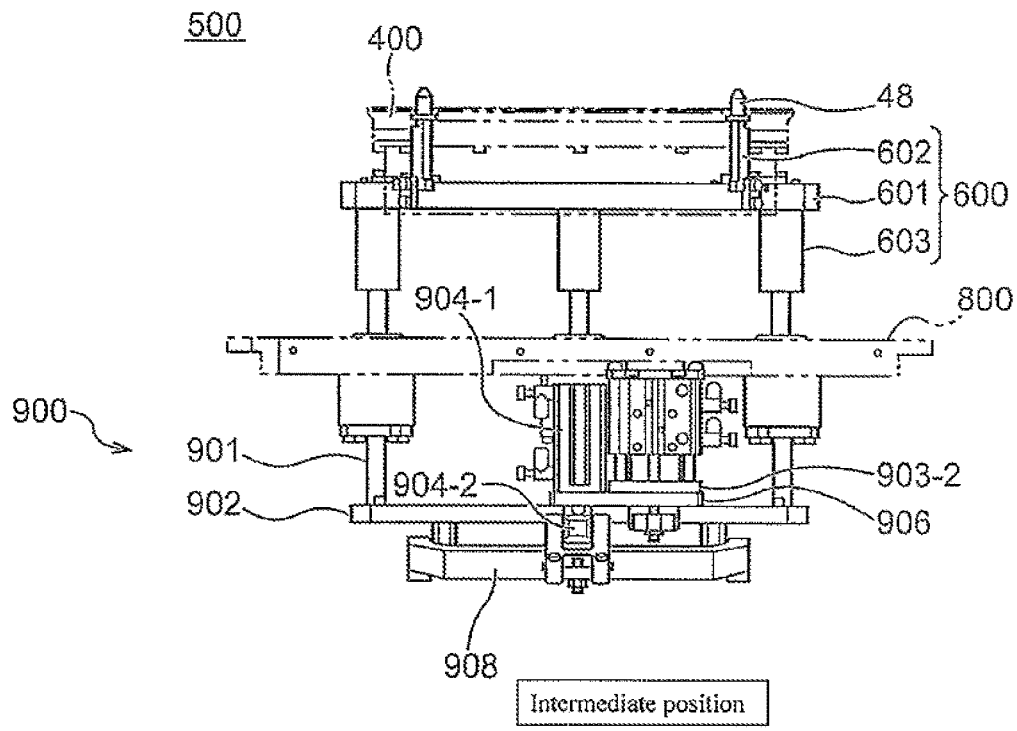
FIG. 6B is a front view showing the lift pin operating device when the lift pins are in the intermediate position.
Figure 7A:
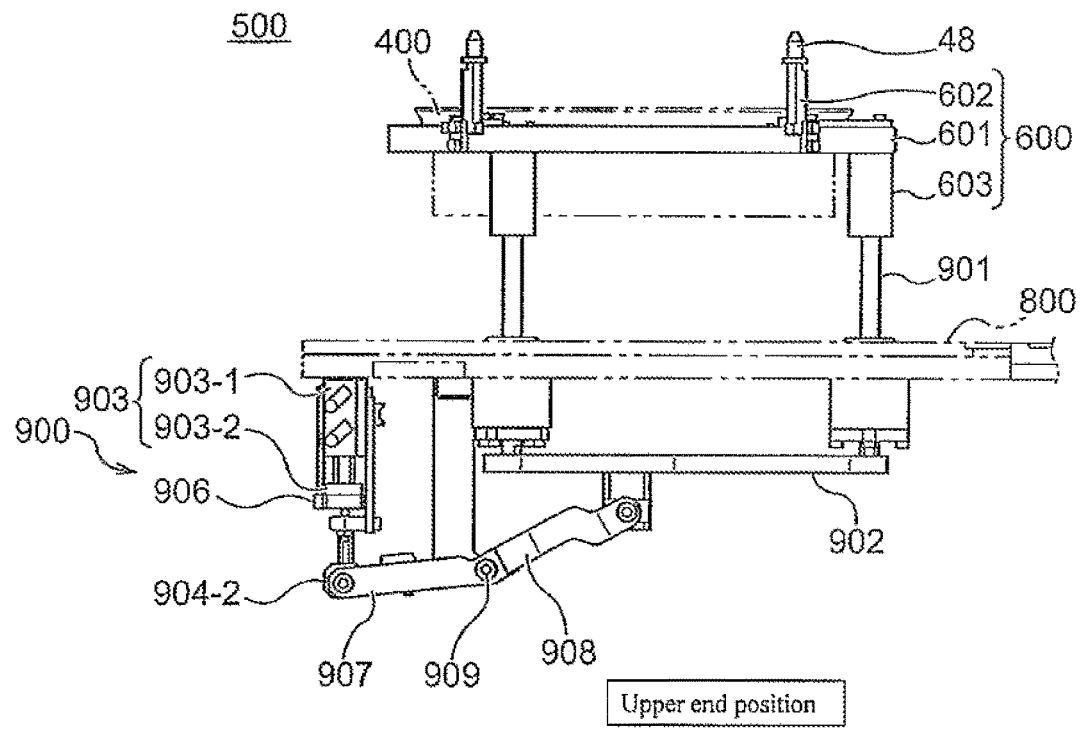
FIG. 7A is a side view showing the lift pin operating device when the lift pins are in the upper end position.
Figure 7B:
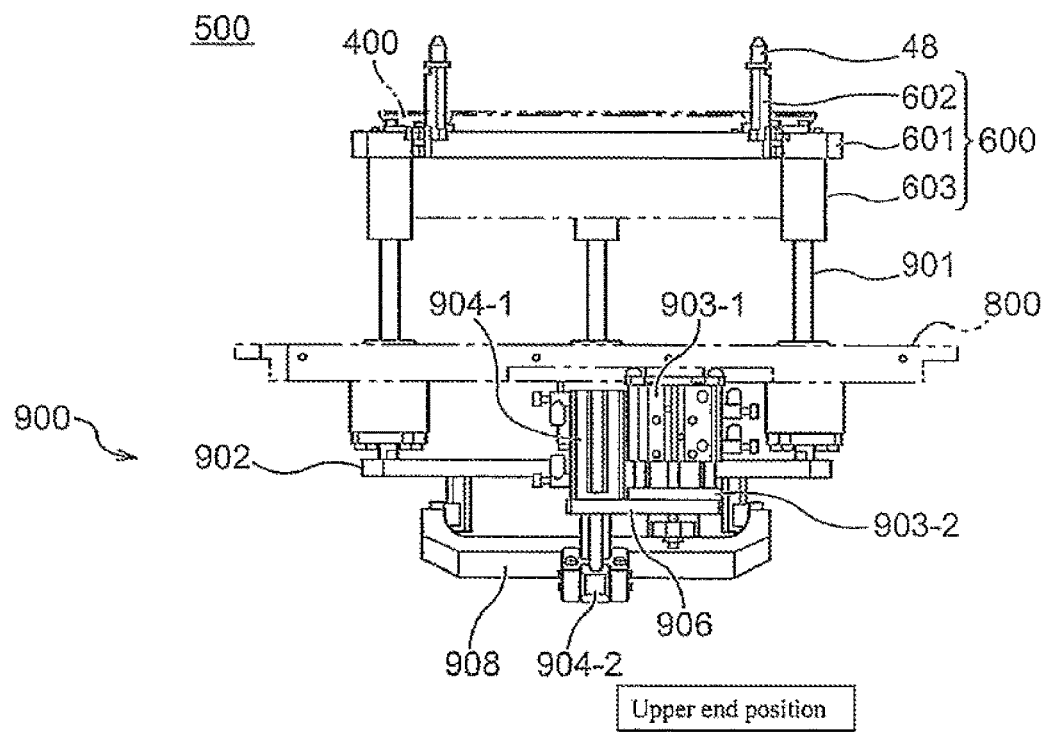
FIG. 7B is a front view showing the lift pin operating device when the lift pins are in the upper end position.

The substrate processing apparatus of this embodiment has a lift pin operating device 500 for raising or lowering the plurality of lift pins 48 relative to the buffing table 400. FIGS. 5A to 7B show an example of the lift pin operating device 500. FIGS. 5A and 5B are a side view and a front view, respectively, showing the lift pin operating device 500 when the lift pins 48 are in the lower end position. FIGS. 6A and 6B are a side view and a front view, respectively, showing the lift pin operating device 500 when the lift pins 48 are in the intermediate position. FIGS. 7A and 7B are a side view and a front view, respectively, showing the lift pin operating device 500 when the lift pins 48 are in the upper end position.

The lift pin operating device 500 has a lift pin holding member 600 disposed along the outer periphery of the buffing table 400 and having the plurality of lift pins 48 attached thereto, and a lift pin holding member operating device 900 (hereinafter referred to as the "holding member operating device 900") for raising or lowering the lift pin holding member 600 relative to the buffing table 400. It should be noted that, in FIGS. 5A to 7B, the buffing table 400 and a top plate 800 are shown by two-dot chain lines. The top plate 800 is a member constituting a bottom wall that defines a space for accommodating the buffing table 400. It should be noted that, in FIGS. 5A to 7B, an illustration of a rotating mechanism and so forth for the buffing table 400 is omitted.

The lift pin holding member 600 has a ring-shaped body part 601 disposed along the outer periphery of the buffing table 400, circular cylindrical lift pin holding parts 602 secured to the ring-shaped body part 601, and base parts 603. The proximal end portion of each of the plurality of lift pins 48 may be secured to the inner side of the associated lift pin holding part 602 by screwing or the like (see FIGS. 4A to 4C).

The holding member operating device 900 has a plurality (three in this embodiment) of elevating rods 901. Each elevating rod 901 is secured at one end thereof to the associated base part 603 of the lift pin holding member 600 and extends downward through an opening (not shown) formed in the top plate 800. The plurality of elevating rods 901 are slidable through the respective openings in the top plate 800 and vertically movable relative to the buffing table 400. The lower ends of the elevating rods 901 are secured to a base plate 902. Accordingly, by raising and lowering the base plate 902, the elevating rods 901, the lift pin holding member 600, and the lift pins 48 can be vertically moved relative to the buffing table 400. For this purpose, the holding member operating device 900 in this embodiment has a first piston-cylinder device 903 and a second piston-cylinder device 904, which are attached to the top plate 800 and disposed in parallel to each other.

The first piston-cylinder device 903 has a first cylinder part 903-1 secured to the top plate 800 (hence, fixed in position relative to the buffing table 400.) Further, the first piston-cylinder device 903 has a first piston part 903-2 disposed in the first cylinder part 903-1 and slidable toward or away from the buffing table 400.

The second piston-cylinder device 904 has a second cylinder part 904-1 and a second piston part 904-2 disposed in the second cylinder part 904-1 and slidable toward or away from the buffing table 400. It should be noted that FIGS. 5A, 6A and 7A are side views of the lift pin operating device 500 as seen from the first piston-cylinder device 903 side. Accordingly, in FIGS. 5A, 6A and 7A, only the second piston part 904-2 is shown with regard to the second piston-cylinder device 904.

The first piston part 903-2 of the first piston-cylinder device 903 is secured to an intermediate plate 906. To the intermediate plate 906 is secured the lower end of the second cylinder part 904-1 of the second piston-cylinder device 904. In other words, the second cylinder part 904-1 of the second piston-cylinder device 904 is secured to the first piston part 903-2 of the first piston-cylinder device 903 through the intermediate plate 906. Accordingly, the second cylinder part 904-1 and the first piston part 903-2 can move vertically as one unit. The second piston part 904-2 has a piston rod portion 904-2*c* extending through the intermediate plate 906, and a piston body portion 904-2*b* is disposed below the intermediate plate 906 (see FIG. 8).

The piston body portion 904-2*b* of the second piston part 904-2 is operatively connected to the base plate 902 through a lever member (reference symbol omitted). Specifically, the lever member has a first lever part 907 disposed on the second piston part 904-2 side, and a second lever part 908 disposed on the base plate 902 side. A pivot 909 is provided between the first lever part 907 and the second lever part 908. In this embodiment, the pivot 909 is secured to a support of the top plate 800.

The first lever part 907 is hinged to the piston body portion 904-2*b* of the second piston part 904-2. When the end of the first lever part 907 is pushed down by the piston body portion 904-2*b*, the lever member pivots about the pivot 909. Consequently, the base plate 902-side end of the second lever part 908 is raised. The base plate 902-side end of the second lever part 908 is hinged to the base plate 902. Accordingly, the second lever part 908 pivots upward about the pivot 909, causing the base plate 902 to be pushed up.

Figure 8:
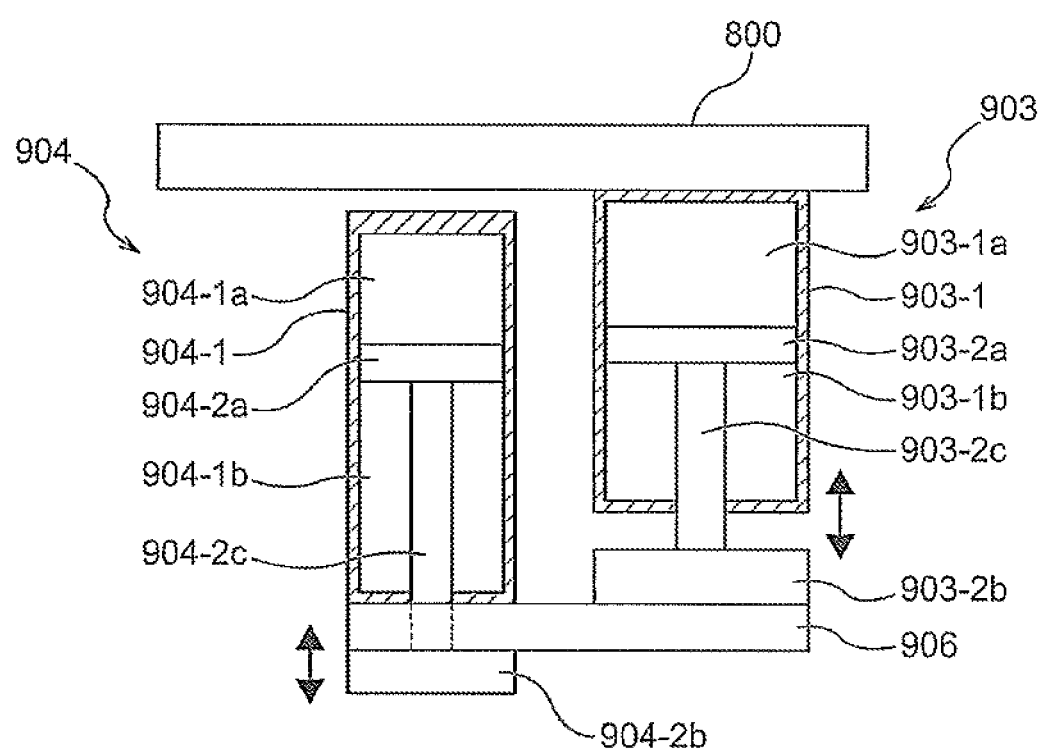
FIG. 8 is a schematic view showing the operating principle of piston-cylinder devices constituting the lift pin operating device.

In this embodiment, the combination of the first piston-cylinder device 903 and the second piston-cylinder device 904 enables the lift pins 48 to be stepwisely moved between the upper end position, the intermediate position, and the lower end position. FIG. 8 is a schematic view showing the operating principle of the first and second piston-cylinder device 903 and 904.

As shown in FIG. 8, the first piston-cylinder device 903 and the second piston-cylinder device 904 are disposed in parallel to each other. The upper wall of the first cylinder part 903-1 of the first piston-cylinder device 903 is secured to the top plate 800.

The interior of the first cylinder part 903-1 of the first piston-cylinder device 903 is divided into an upper chamber 903-1*a* and a lower chamber 903-1*b* by a piston body portion 903-2*a*. The upper chamber 903-1*a* and the lower chamber 903-1*b* are supplied with a working fluid (e.g. air) through respective fluid supply ports (not shown).

A piston rod portion 903-2*c* extending from the piston body portion 903-2*a* extends downward through the bottom wall of the first cylinder part 903-1, and a piston body portion 903-2*b* is secured to the lower end of the piston rod portion 903-2*c*. The intermediate plate 906 is integrally secured to the lower surface of the piston body portion 903-2*b*.

On the other hand, the interior of the second cylinder part 904-1 of the second piston-cylinder device 904 is divided into an upper chamber 904-1*a* and a lower chamber 904-1*b* by a piston body portion 904-2*a*. The upper chamber 904-1*a* and the lower chamber 904-1*b* are supplied with a working fluid (e.g. air) through respective fluid supply ports (not shown).

The bottom wall of the second cylinder part 904-1 is integrally secured to the intermediate plate 906 so that the second cylinder part 904-1 and the intermediate plate 906 are movable as one unit. The piston rod portion 904-2*c* extending from the piston body portion 904-2*a* extends downward through the bottom wall of the second cylinder part 904-1 and through the intermediate plate 906. The piston body portion 904-2*b* is secured to the lower end of the piston rod portion 904-2*c*.

In this embodiment, the inner diameter of the first cylinder part 903-1 is set larger than the inner diameter of the second cylinder part 904-1.

By using the above-described first piston-cylinder device 903 and second piston-cylinder device 904, the lift pins 48 can be raised and lowered by the following method, for example. In the lower end position of the lift pins 48, shown in FIGS. 5A and 5B, both the first piston-cylinder device 903 and the second piston-cylinder device 904 are in an inoperative state. That is, the first piston-cylinder device 903 and the second piston-cylinder device 904 are each in a contracted state, and the first and second piston parts 903-2 and 904-2 are each in an upper position.

In the intermediate position of the lift pins 48, shown in FIGS. 6A and 6B, only the first piston-cylinder device 903 is in an extended state, and the second piston-cylinder device 904 is in the contracted state. It should be noted that, in this embodiment, the inner diameter of the first cylinder part 903-1 is set larger than the inner diameter of the second cylinder part 904-1, as has been stated above. Accordingly, even when the supply pressure of the working fluid supplied to the upper chamber 903-1a of the first cylinder part 903-1 and the supply pressure of the working fluid supplied to the upper chamber 904-1a of the second cylinder part 904-1 are equal to each other, the extension of the first piston-cylinder device 903 will not be interfered with by the pressure of the fluid acting on the upper wall of the second cylinder part 904-1. However, the inner diameter of the first cylinder part 903-1 and the inner diameter of the second cylinder part 904-1 may be set equal to each other. In this case, the same advantages as the above can be obtained by providing a difference between the supply pressure of the working fluid supplied to the upper chamber 903-1a and the supply pressure of the working fluid supplied to the upper chamber 904-1a.

As the piston body portion 903-2b is lowered, the intermediate plate 906 and the second cylinder part 904-1 are lowered, and this pushes down the end of the first lever part 907 that is hinged to the piston body portion 904-2b. Consequently, the lever member pivots about the pivot 909, causing the end portion of the second lever part 908 to push up the base plate 902. Accordingly, the elevating rods 901 and the lift pin holding member 600, which is secured to the elevating rods 901, are raised, and the lift pins 48 are raised to the intermediate position.

In the upper end position shown in FIGS. 7A and 7B, both the first and second piston-cylinder devices 903 and 904 are in an operative state. That is, the first piston-cylinder device 903 and the second piston-cylinder device 904 are each in an extended state. Accordingly, the end portion of the first lever part 907 is pushed down to the maximum, and the end portion of the second lever part 908 pushes up the base plate 902 to the maximum. Thus, the elevating rods 901 and the lift pin holding member 600 are further raised, and the lift pins 48 are raised to the upper end position.

It should be noted that, in this embodiment, the vertical movement of the lift pins 48 between the lower end position and the intermediate position is effected by the output of the first piston-cylinder device 903, and that the vertical movement of the lift pins 48 between the intermediate position and the upper end position is effected by the output of the second piston-cylinder device 904. Therefore, it is possible to individually adjust the moving speed of the lift pins 48 between the lower end position and the intermediate position and the moving speed of the lift pins 48 between the intermediate position and upper end position by individually adjusting an extension/retraction speed of the piston of each piston-cylinder device. Thus, it is possible to move the substrate up and down rapidly without causing damage thereto.

It should be noted that, although in this embodiment piston-cylinder devices are used as the holding member operating device 900, the lift pin holding member 600 may be operated by a motor.

Figure 9:
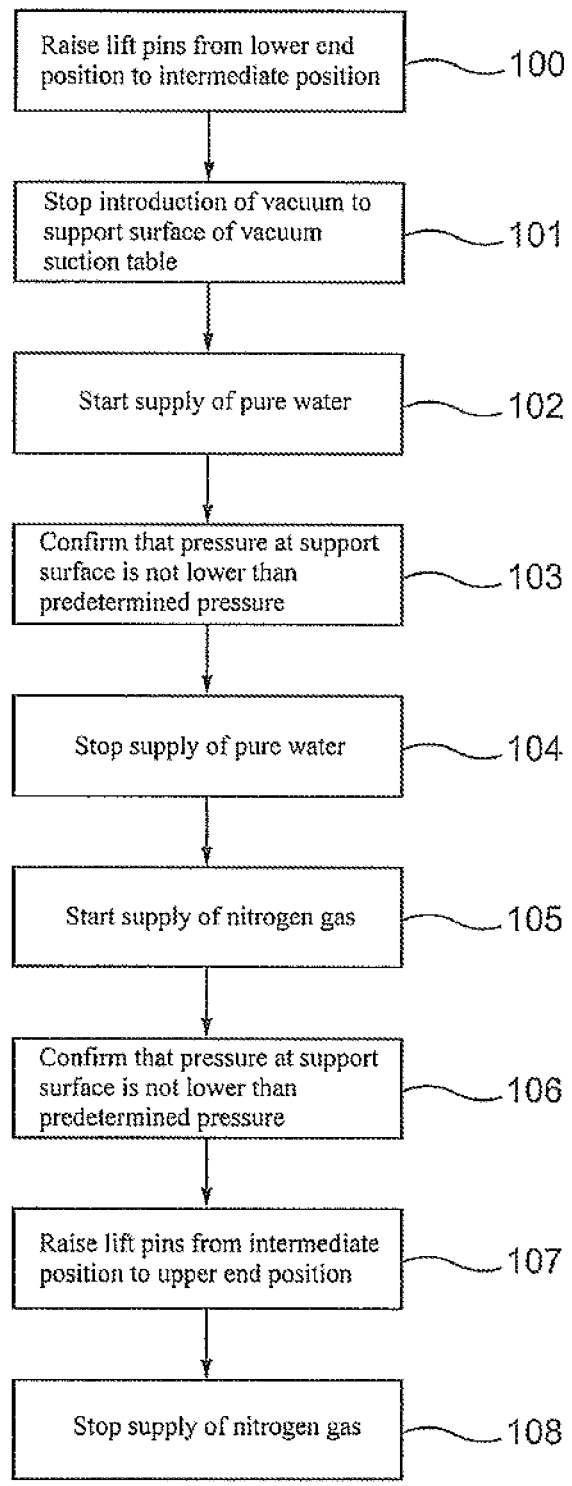
FIG. 9 is a flowchart showing the steps of a process for detaching a substrate from the vacuum suction table according to one embodiment of the present invention.

FIG. 9 shows an example of the steps of a process for detaching a wafer WF from the buffing table 400 according to one embodiment of the present invention. In this example, after completion of a buffing process, the plurality of lift pins 48 disposed along the outer periphery of the buffing table 400 in the lower end position shown in FIGS. 5A and 5B are raised to the intermediate position shown in FIGS. 6A and 6B (Step 100). In a state where the lift pins 48 are held in the intermediate position, the introduction of a vacuum to the support surface 402 of the buffing table 400 through the vacuum passage 410 is stopped (Step 101). Thereafter, pure water is supplied to the support surface 402 of the buffing table 400 through the vacuum passage 410 under a predetermined pressure (e.g. 0.2 MPa) (Step 102). The supply of pure water is performed for a predetermined time period (e.g. from 3 to 5 seconds) which is properly determined, and the pressure in the vacuum passage 410 (hence, the pressure at the support surface 402) is measured during the supply of pure water. When it is confirmed that the measured pressure has reached a pressure not lower than a predetermined pressure (e.g. not lower than the atmospheric pressure) (Step 103), the supply of pure water is stopped (Step 104). Thereafter, nitrogen gas is supplied to the support surface 402 of the buffing table 400 through the vacuum passage 410 under a predetermined pressure (e.g. 0.08 MPa) (Step 105). The supply of nitrogen gas is performed for a predetermined time period (e.g. from 3 to 5 seconds), and the pressure in the vacuum passage 410 (hence, the pressure at the support surface 402) is measured during the supply of nitrogen gas. When it is confirmed that the measured pressure is not lower than a predetermined pressure (e.g. not lower than the atmospheric pressure) (Step 106), the lift pins 48 are raised to the upper end position shown in FIGS. 7A and 7B (Step 107). While the lift pins 48 are being raised, nitrogen gas is continuously supplied to the support surface 402 of the buffing table 400. When the lift pins 48 are positioned in the upper end position, the supply of nitrogen gas is stopped (Step 108).

The pure water supply pressure and supply time are not limited to those in the above-described example. Similarly, the nitrogen gas supply pressure and supply time are not limited to those in the above-described example. Although in the above-described example pure water and nitrogen gas are used as fluids for vacuum break, only either one of pure water or nitrogen gas may be supplied. It is also possible to use clean dry air in place of nitrogen gas.

By supplying pure water and/or nitrogen gas to the support surface 402 of the buffing table 400, the vacuum state between the support surface 402 of the buffing table 400 and the wafer WF is broken. At this time, the wafer WF detached from the support surface 402 is levitated from the support surface 402 by the spouting pure water and/or nitrogen gas. In this instance, if there are no lift pins such as those in this embodiment, there is a possibility that the wafer WF will slide sideways relative to the support surface 402 of the buffing table 400. According to this embodiment, the outer periphery of the wafer WF can be surrounded by the substrate guide surfaces 48-1 of the lift pins 48 disposed in the intermediate position with a slight gap between the substrate guide surfaces 48-1 and the outer peripheral end surface of the wafer WF (see FIG. 2); therefore, there is no possibility of the detached wafer WF being slid sideways relative to the support surface 402 to an extent exceeding the slight gap between the substrate guide surfaces 48-1 and the outer peripheral end surface of the wafer WF. Thus, according to one embodiment of the present invention, the lift pins 48 are held in the intermediate position between the lower end position and the upper end position while the vacuum is being broken between the wafer WF and the support surface 402. Accordingly, the wafer WF can be detached from the buffing table 400 without the possibility of damaging the wafer WF by the lift pins 48.

Figure 10:
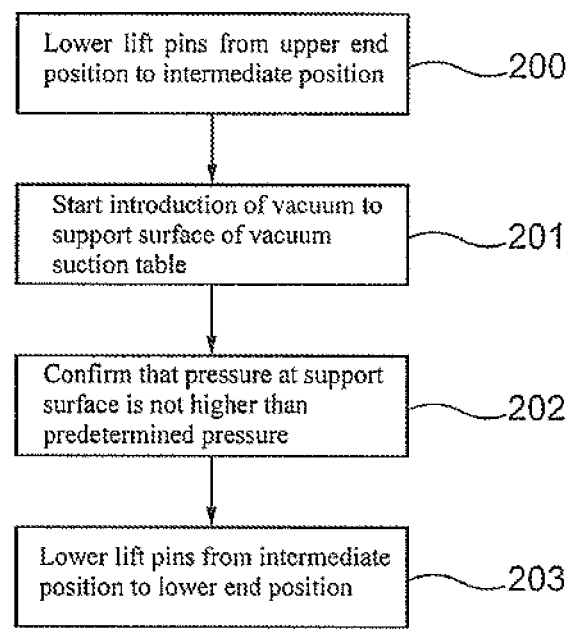
FIG. 10 is a flowchart showing the steps of a process for placing a substrate onto the vacuum suction table according to one embodiment of the present invention.

According to one embodiment of the present invention, the plurality of lift pins 48 disposed along the outer periphery of the buffing table 400 can also be stepwisely moved between the lower end position, the upper end position, and the intermediate position in the steps of a process for placing a wafer WF onto the buffing table 400. FIG. 10 shows an example of the steps of a process for placing a wafer WF onto the buffing table 400 according to one embodiment of the present invention. In this example, in the upper end position shown in FIGS. 7A and 7B, the lift pins 48 disposed along the outer periphery of the buffing table 400 receive a wafer WF from the transfer robot, and thereafter, the lift pins 48 are lowered to the intermediate position shown in FIGS. 6A and 6B (Step 200). When the lift pins 48 receive the wafer WF from the transfer robot, there is a possibility of the wafer WF being slightly dislocated at the distal end portions of the lift pins 48. In this case, however, the tapered portions 48-1a of the substrate guide surfaces 48-1 of the lift pins 48 are capable of guiding the wafer WF so that wafer WF can be placed in an appropriate position on the substrate holding surfaces 48-2. Subsequently, with the lift pins 48 held in the intermediate position, a vacuum is introduced to the support surface 402 of the buffing table 400 through the vacuum passage 410 (Step 201). When it is confirmed that the pressure in the vacuum passage 410 (hence, the pressure at the support surface 402) has reached a pressure not higher than a predetermined pressure (Step 202), the plurality of lift pins 48 are lowered from the intermediate position to the lower end position shown in FIGS. 5A and 5B (Step 203). In this example, particularly when there is water or the like on the support surface 402, the wafer WF can be suppressed from being slid sideways on the support surface 402.

The lift pins in this embodiment are fixed in position with respect to a direction of rotation of the buffing table, and therefore do not rotate together with the buffing table. In other embodiments, however, a mechanism which enables the lift pins and the buffing table to rotate together as a unit may be employed.

The present invention includes the following embodiments.

1. A substrate processing apparatus having a vacuum suction table adapted to have a substrate placed thereon, and a plurality of lift pins disposed along the outer periphery of the vacuum suction table, the plurality of lift pins each having a distal end portion including a substrate guide surface capable of guiding the outer peripheral end surface of the substrate, and a proximal end portion including a substrate holding surface extending from the substrate guide surface outwardly in a radial direction of the lift pin; the plurality of lift pins being stoppable in a lower end position where the substrate guide surface of each of the lift pins is disposed below a suction-holding surface of the vacuum suction table, an upper end position where the substrate holding surface of each of the lift pins is disposed above the suction-holding surface of the vacuum suction table, and an intermediate position between the lower end position and the upper end position; wherein, in the intermediate position, the substrate guide surface of each of the lift pins is disposed above the suction-holding surface of the vacuum suction table, and the substrate holding surface of each of the lift pins is disposed below the suction-holding surface of the vacuum suction table.

2. The substrate processing apparatus described in item 1 above, wherein the vacuum suction table has a vacuum passage through which a vacuum is introduced to the suction-holding surface of the vacuum suction table; the plurality of lift pins being adapted to be held in the intermediate position until the pressure in the vacuum passage reaches a pressure not lower than a predetermined pressure after the introduction of a vacuum to the suction-holding surface of the vacuum suction table has been stopped.

3. The substrate processing apparatus described in item 2 above, wherein the plurality of lift pins are adapted to be held in the intermediate position until the pressure in the vacuum passage reaches a pressure not higher than a predetermined pressure after the introduction of a vacuum to the suction-holding surface of the vacuum suction table has been started.

4. The substrate processing apparatus described in any one of items 1 to 3 above, further comprising a first piston-cylinder device adapted to raise the plurality of lift pins from the lower end position to the intermediate position, and a second piston-cylinder device adapted to raise the plurality of lift pins from the intermediate position to the upper end position.

5. The substrate processing apparatus described in any one of items 1 to 3 above, further comprising a lift pin operating device adapted to raise or lower the plurality of lift pins relative to the vacuum suction table, the lift pin operating device having a lift pin holding member disposed along the outer periphery of the vacuum suction table and adapted to have the plurality of lift pins attached thereto, and a lift pin holding member operating device adapted to raise or lower the lift pin holding member relative to the vacuum suction table, the lift pin holding member operating device having a first piston-cylinder device and a second piston-cylinder device, the plurality of lift pins being adapted to be moved to the intermediate position by the operation of either one of the first piston-cylinder device and the second piston-cylinder device.

6. The substrate processing apparatus described in item 5 above, wherein the first piston-cylinder device has a first cylinder part fixed in position relative to the vacuum suction table, the first piston-cylinder device further having a first piston part disposed in the first cylinder part and slidable toward or away from the vacuum suction table, the second piston-cylinder device having a second cylinder part fixed in position relative to the first piston part, the second piston-cylinder device further having a second piston part disposed in the second cylinder part and slidable toward or away from the vacuum suction table, the first cylinder part being larger in inner diameter than the second cylinder part, the plurality of lift pins being adapted to be moved to the intermediate position by the operation of the first piston-cylinder device.

7. The substrate processing apparatus described in any one of items 1 to 6, which is a buffing apparatus, wherein the vacuum suction table is a buffing table.

8. A method of detaching a substrate from a vacuum suction table of a substrate processing apparatus, the method including stopping a plurality of lift pins, disposed along the outer periphery of the vacuum suction table, in a lower end position where the lift pins do not interfere with the rotation of the vacuum suction table, an upper end position where the lift pins hold the substrate above a suction-holding surface of the vacuum suction table, and an intermediate position between the lower end position and the upper end position, the method comprising the steps of: raising the plurality of lift pins from the lower end position to the intermediate position; stopping introduction of a vacuum to the suction-holding surface of the vacuum suction table; supplying a fluid to the suction-holding surface of the vacuum suction table; and raising the plurality of lift pins from the intermediate position to the upper end position when the pressure at the suction-holding surface of the vacuum suction table reaches a pressure not lower than a predetermined pressure.

9. A method of placing a substrate onto a vacuum suction table of a substrate processing apparatus, the method including stopping a plurality of lift pins, disposed along the outer periphery of the vacuum suction table, in a lower end position where the lift pins do not interfere with the rotation of the vacuum suction table, an upper end position where the lift pins hold the substrate above a suction-holding surface of the vacuum suction table, and an intermediate position between the lower end position and the upper end position, the method comprising the steps of: lowering the plurality of lift pins from the upper end position to the intermediate position; introducing a vacuum to the suction-holding surface of the vacuum suction table; and lowering the plurality of lift pins from the intermediate position to the lower end position when the pressure at the suction-holding surface of the vacuum suction table reaches a pressure not higher than a predetermined pressure.

10. The method described in item 8 above, wherein the substrate processing apparatus is a buffing apparatus, and the vacuum suction table is a buffing table.

11. The method described in item 9 above, wherein the substrate processing apparatus is a buffing apparatus, and the vacuum suction table is a buffing table.

Although the embodiments of the present invention have been described above based on some examples, the described embodiments are for the purpose of facilitating the understanding of the present invention and are not intended to limit the present invention. The present invention may be modified and improved without departing from the spirit thereof, and the invention includes equivalents thereof. In addition, the elements described in the claims and the specification can be arbitrarily combined or omitted within a range in which the above-mentioned problems are at least partially solved, or within a range in which at least a part of the advantages is achieved.

This application claims priority under the Paris Convention to Japanese Patent Application No. 2015-238395 filed on Dec. 7, 2015. The entire disclosure of Japanese Patent Application No. 2015-238395 filed on Dec. 7, 2015 including specification, claims, drawings and summary is incorporated herein by reference in its entirety. The entire disclosure of Japanese Patent Laid-Open Publication No. Hei 9-92633 (Patent Document 1) and Japanese Patent Laid-Open Publication No. Hei 8-71511 (Patent Document 2) each including specification, claims, drawings and summary is incorporated herein by reference in its entirety.

INDUSTRIAL APPLICABILITY

The present invention is widely applicable to a substrate processing apparatus having a vacuum suction table adapted to have a substrate placed thereon, and a plurality of lift pins disposed along the outer periphery of the vacuum suction table.

REFERENCE SIGNS LIST

4A: rotation axis
WF: wafer (substrate)
48: lift pins
48-1: substrate guide surface
48-1a: tapered portion
48-2: substrate holding surface
300A: buffing apparatus
400: buffing table (vacuum suction table)
402: support surface (suction-holding surface)
404: openings
410: vacuum passage
412: pressure sensor
450: backing material
452: through-holes
454: cut-out portions
500: lift pin operating device
714: pure water supply source
724-2: chemical solution supply source
744: nitrogen source
750: on-off valve
752: on-off valve
754: on-off valve
756: on-off valve
600: lift pin holding member
601: ring-shaped body part
602: lift pin holding parts
603: base parts
800: top plate
900: lift pin holding member operating device
901: elevating rods
902: base plate
903: first piston-cylinder device
903-1: first cylinder part
903-2: first piston part
903-1a: upper chamber
903-1b: lower chamber
903-2a: piston body portion
903-2b: piston body portion
903-2c: piston rod portion
904: second piston-cylinder device
904-1: second cylinder part
904-2: second piston part
904-1a: upper chamber
904-1b: lower chamber
904-2a: piston body portion
904-2b: piston body portion
904-2c: piston rod portion
906: intermediate plate
907: first lever part
908: second lever part
909: pivot

What is claimed is:

1. A substrate processing apparatus comprising:
a vacuum suction table having a suction-holding surface adapted to have a substrate placed thereon; and
a plurality of lift pins disposed along an outer periphery of the vacuum suction table;
the plurality of lift pins each having a distal end portion including a substrate guide surface that is vertical relative to the suction-holding surface of the vacuum suction table and capable of guiding an outer peripheral end surface of the substrate, and a proximal end portion including a substrate holding surface extending from a lower end of the substrate guide surface toward a center of the vacuum suction table,
the substrate holding surface being configured to contact the substrate and have the substrate placed thereon;
the plurality of lift pins being stoppable in a lower end position where the substrate guide surface of each of the lift pins is disposed below the suction-holding surface of the vacuum suction table, an upper end position where the substrate holding surface of each of the lift pins is disposed above the suction-holding surface of the vacuum suction table, and an intermediate position between the lower end position and the upper end position;
wherein, in the intermediate position, the substrate guide surface of each of the lift pins is disposed above the suction-holding surface of the vacuum suction table, and the substrate holding surface of each of the lift pins is disposed lower than the suction-holding surface of the vacuum suction table so as to have a gap between the suction-holding surface and the substrate holding surface;

wherein the substrate processing apparatus further comprises a first piston-cylinder device configured to raise the plurality of lift pins from the lower end position to the intermediate position, and a second piston-cylinder device configured to raise the plurality of lift pins from the intermediate position to the upper end position; and wherein the vacuum suction table has a vacuum passage through which a vacuum is introduced to the suction-holding surface of the vacuum suction table;

the plurality of lift pins being adapted to be held in the intermediate position until a pressure in the vacuum passage reaches a pressure not lower than a predetermined pressure after introduction of a vacuum to the suction-holding surface of the vacuum suction table has been stopped; and wherein in each of the upper end position and the intermediate position, the substrate guide surfaces of the plurality of lift pins surround the outer peripheral end surface of the substrate placed on the vacuum suction table, wherein the first piston-cylinder device has a piston part secured to an intermediate plate and the second piston-cylinder device has a cylinder part having a lower end secured to the intermediate plate, wherein the second piston-cylinder device has a piston part including a piston rod portion extending through the intermediate plate and a piston body portion disposed below the intermediate plate, wherein the first piston-cylinder device and the second piston-cylinder device are disposed in parallel to each other, and the first piston-cylinder device has a cylinder part having an upper wall secured to a top plate, wherein the substrate processing apparatus further comprises a first lever part disposed on a side of the piston part of the second piston-cylinder device and a second lever part disposed on a side of a base plate, wherein a pivot is provided between the first lever part and the second lever part.

2. The substrate processing apparatus of claim 1, wherein the plurality of lift pins are adapted to be held in the intermediate position until a pressure in the vacuum passage reaches a pressure not higher than a predetermined pressure after introduction of a vacuum to the suction-holding surface of the vacuum suction table has been started.

3. The substrate processing apparatus of claim 1, further comprising:
a lift pin operating device adapted to raise or lower the plurality of lift pins relative to the vacuum suction table;
the lift pin operating device having a lift pin holding member and a lift pin holding member operating device adapted to raise or lower the lift pin holding member relative to the vacuum suction table;
the lift pin holding member having a ring-shaped body part disposed along the outer periphery of the vacuum suction table, and cylindrical lift pin holding parts secured to the ring-shaped body part and adapted to have the plurality of lift pins attached thereto,
the lift pin holding member operating device having the first piston-cylinder device and the second piston-cylinder device;
the plurality of lift pins being adapted to be moved to the intermediate position by an operation of either one of the first piston-cylinder device and the second piston-cylinder device.

4. The substrate processing apparatus of claim 3, wherein the cylinder part of the first piston-cylinder device is fixed in position relative to the vacuum suction table, the piston part of the first piston-cylinder device being disposed in the cylinder part of the first piston-cylinder device and slidable toward or away from the vacuum suction table;
the cylinder part of the second piston-cylinder device being fixed in position relative to the piston part of the first piston-cylinder device, the piston part of the second piston-cylinder device being disposed in the cylinder part of the second piston-cylinder device and slidable toward or away from the vacuum suction table;
the cylinder part of the first piston-cylinder device being larger in inner diameter than the cylinder part of the second piston-cylinder device;
the plurality of lift pins being adapted to be moved to the intermediate position by an operation of the first piston-cylinder device.

5. The substrate processing apparatus of claim 1, which is a buffing apparatus, wherein the vacuum suction table is a buffing table.

6. The substrate processing apparatus of claim 1, wherein the first lever part is hinged to the piston body of the piston part of the second piston-cylinder device.

7. The substrate processing apparatus of claim 6, wherein an end of the second lever part on the side of the base plate is hinged to the base plate.

* * * * *